United States Patent [19]

Noe

[11] 3,978,516
[45] Aug. 31, 1976

[54] LEAD FRAME ASSEMBLY FOR A PACKAGED SEMICONDUCTOR MICROCIRCUIT

[75] Inventor: Terry Wayne Noe, Richardson, Tex.

[73] Assignee: Texas Instruments Incorporated, Dallas, Tex.

[22] Filed: Feb. 4, 1974

[21] Appl. No.: 439,460

Related U.S. Application Data

[62] Division of Ser. No. 320,349, Jan. 2, 1974.

[52] U.S. Cl. ............................. 357/70; 357/65; 357/68; 357/80
[51] Int. Cl.² .............. H01L 23/48; H01L 29/44; H01L 29/52; H01L 29/60
[58] Field of Search ................. 317/234, 3, 4, 4.1, 317/5, 5.3, 5.4; 357/70, 68, 74, 80, 65; 174/52 FP

[56] References Cited
UNITED STATES PATENTS

| | | | |
|---|---|---|---|
| 3,440,027 | 4/1969 | Hugle | 317/234 N |
| 3,544,857 | 12/1970 | Byrne et al. | 317/234 N |
| 3,662,230 | 5/1972 | Redwantz | 317/234 N |
| 3,748,726 | 7/1973 | Wiesner | 317/234 N |
| 3,778,685 | 12/1973 | Kennedy | 317/234 N |
| 3,778,686 | 12/1973 | Galvin et al. | 357/74 |
| 3,781,596 | 12/1973 | Galli et al. | 317/234 G |
| 3,793,714 | 2/1974 | Bylander | 357/70 |
| 3,868,724 | 2/1975 | Perrino | 357/80 |
| 3,868,725 | 2/1975 | Degraaff | 357/68 |

OTHER PUBLICATIONS

Electronics; *Film Plays Supporting Role in Automating IC Assembly;* Feb. 1, 1971, pp. 43 to 48.
IBM Technical Disclosure Bulletin; *Joining Integrated Circuit Chips to Substrates;* by Schmeckenbeacher, vol. 14, No. 1, June 1971, pp. 94 & 95.

*Primary Examiner*—Andrew J. James
*Attorney, Agent, or Firm*—Harold Levine; James T. Comfort; Gary C. Honeycutt

[57] ABSTRACT

A dual-in-line plastic package for an integrated circuit is assembled with the use of a thermal stress-resistant thin-film interconnect pattern on a flexible insulator film. All electrical connections to the semiconductor chip are made simultaneously by bonding directly to the thin-film interconnect pattern. Each segment of the interconnect pattern is then connected simultaneously to a simplified external lead frame, by means of a novel soldering technique. The assembly is then ready for plastic encapsulation and final trimming. By supplying both the flexible interconnect pattern and the external lead frame in continuous coils or reels, a high degree of handling simplicity, speed and accuracy is achieved with a maximum opportunity for automation, to produce a low work content product.

2 Claims, 6 Drawing Figures

LEAD FRAME ASSEMBLY FOR A PACKAGED SEMICONDUCTOR MICROCIRCUIT

This is a division of application Ser. No. 320,349, filed Jan. 2, 1974.

This invention relates to the assembly of semiconductor devices, and more particularly to the assembly of a dual-in-line plastic-encapsulated integrated circuit package, by the use of equipment and techniques suited to the relief of thermal stresses inside the plastic, and a maximum degree of automation.

The assembly of integrated circuits normally requires that the semiconductor chip first be mounted in some manner to a header or other supporting member, followed by wire bonding to form electrical connections between the chip and external lead members. Due to the high labor content involved in bonding wires, the industry has diligently sought to replace wire interconnects, and has sought to develop techniques which reduce work content by maximizing the opportunities for automation.

In general, the molded plastic package has been considered to be the best opportunity for reducing assembly costs. Various approaches to the assembly of lead structures for use in plastic packages have been explored, including, for example, the lead structure and method of U.S. Pat. No. 3,544,857, issued to Robert C. Byrne et al, wherein it has been proposed to join a thin-film interconnect pattern with an external lead frame. However, for a number of reasons, the Byrne system cannot provide a sufficient throughput rate, nor is it capable of providing the high yields and reliability of the present invention.

A severe thermal cycling problem usually arises with a plastic encapsulated device having thin-film interconnects. That is, due to the difference between the coefficient of thermal expansion of the plastic encapsulation and that of the thin-film interconnects, critical stresses are generated in the interconnect film at high temperatures, frequently causing rupture of one or more of the interconnects. Accordingly, it is an object of this invention to relieve such thermal stresses and thereby increase the yields and reliability of a dual-in-line plastic encapsulated integrated circuit.

It is a further object of the invention to improve the speed, accuracy and handling simplicity charactertistic of the automated assembly of integrated circuits. These and other objects will be apparent from the following description of the invention.

The system of the present invention includes a laminated, etched metal interconnect pattern bonded to a flexible insulator film strip having an aperture therein into which the metal pattern terminals extend, thereby providing within the aperture an arrangement of interconnect terminals having the same spacing as the electrical contact points on the semiconductor chip to facilitate registration therewith, and thereby to permit simultaneous bonding of all interconnect terminals to the chip in a single step.

The preferred thin-film interconnect pattern of the invention consists essentially of a thin layer of rolled copper bonded to a flexible synthetic resin film, and includes at its outer periphery a series of expanded bonding areas arranged to maximize the ease of registration or alignment with corresponding areas of an external lead frame during automated assembly operations. Thermal stress relief is provided by the use of rolled copper instead of electro-deposited copper, and by the use of a high-temperature polyamide adhesive.

The external lead frame has a simpler geometry because of the expanded bonding areas on the thin-film interconnect pattern, and is also relieved of the usual requirement that it have thermal expansion characteristics compatible with silicon. Accordingly, the external lead frame is suitably made of a less expensive metal, such as copper or a copper alloy. Also, since the tips of the frame leads are suitably as large as 50 mils, a significant additional reduction in expense is realized because of less critical stamping specifications.

The interconnect pattern and the external lead frame are both coated with tin, or other suitable solder, at least over the areas at which they are to be joined. The step of bonding the interconnects to the lead frame is then achieved by selectively heating the bonding areas, while they are held in contact with each other, to form a solder reflow joint.

In a preferred embodiment of the invention, the formation of the solder reflow joint is automated. While supplying both the lead frame and the interconnect pattern (with the semiconductor chip attached) in strip form from large reels, successive units are indexed in exact alignment with each other by sprocket drive means. Each pair of units is brought to a position of alignment near a heated bonding tool having a head geometry shaped to mate with the bonding areas of the interconnect pattern units and of the lead frame units.

A punching means is then actuated to sever and remove the appropriate portion of the metallized flexible insulator film from the strip and hold it against the heated bonding tool, together with the lead frame unit aligned therewith, for a short time sufficient to soften the tin or solder layer and thereby cause formation of the reflow joint.

The punching means is then withdrawn, both the interconnect strip and the lead frame strip are then advanced one unit, and the bonding operation is repeated. As one can readily appreciate, this operation is simple, rapid and efficiently automated to provide a high throughput rate.

The assembled units are then ready for plastic encapsulation, trimming, testing, and separation in accordance with known techniques. Alternatively, the lead frame strip with chips and interconnect patterns attached is wound on a reel for shipment or storage.

Figure 1:
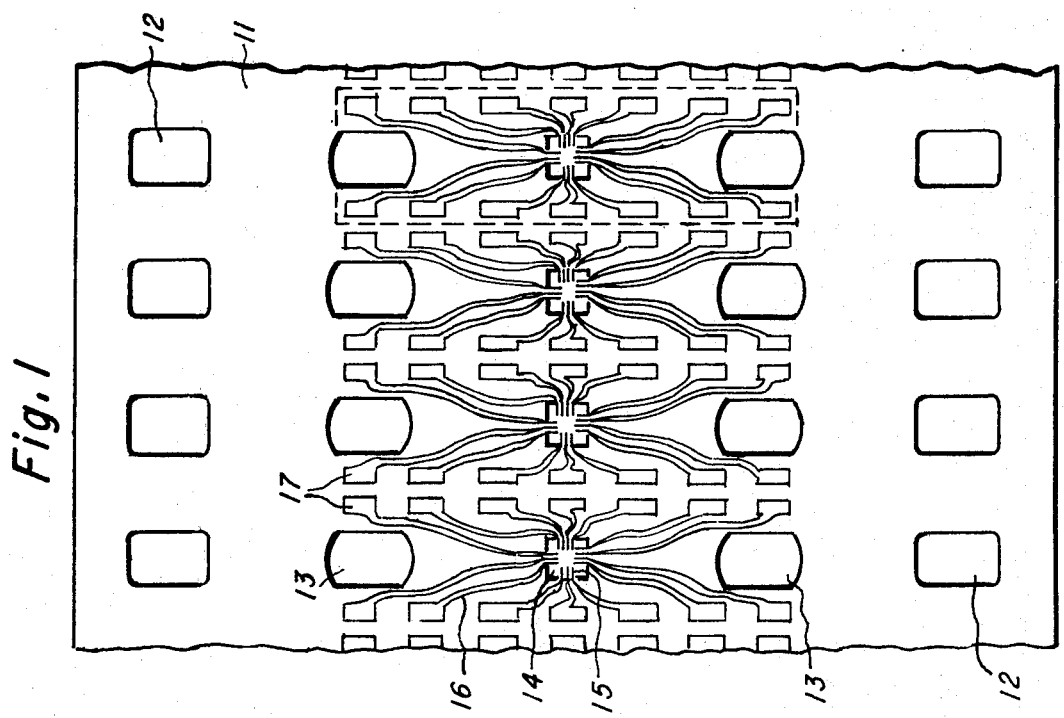
FIG. 1 is an enlarged plan view of the flexible insulator strip having a plurality of interconnect patterns bonded thereon.

The preferred flexible insulator film 11 shown in FIG. 1 consists of "Kapton" polimide plastic film marketed by Du Pont. This film is selected because of its thermal stability and resistance to dimensional changes under stress. The film is provided with three series of apertures: apertures 12 are sprocket holes for permitting sprocket drive and indexing; apertures 13 are provided to allow more rapid equalization of pressure in the molding cavity during the encapsulation procedure; and apertures 14 define the locations at which the semiconductor chips (not shown) are bonded to the cantilevered ends 15 of thin-film interconnect patterns 16. Shortly after a chip is bonded it is preferably protected by a single drop of epoxy resin which hardens and envelopes the chip and its bonds.

In the preferred embodiment shown, the interconnect patterns 16 are formed by laminating the Kapton with a thin film of rolled copper, then forming a pattern of photoresist on the copper, and etching away the unwanted copper in accordance with known methods. Bonding areas 17 are arranged to provide ease of registration with the external lead frame. For example, areas 17 are typically 60 mils wide with up to 40 mils clearance between adjacent areas.

Figure 2:
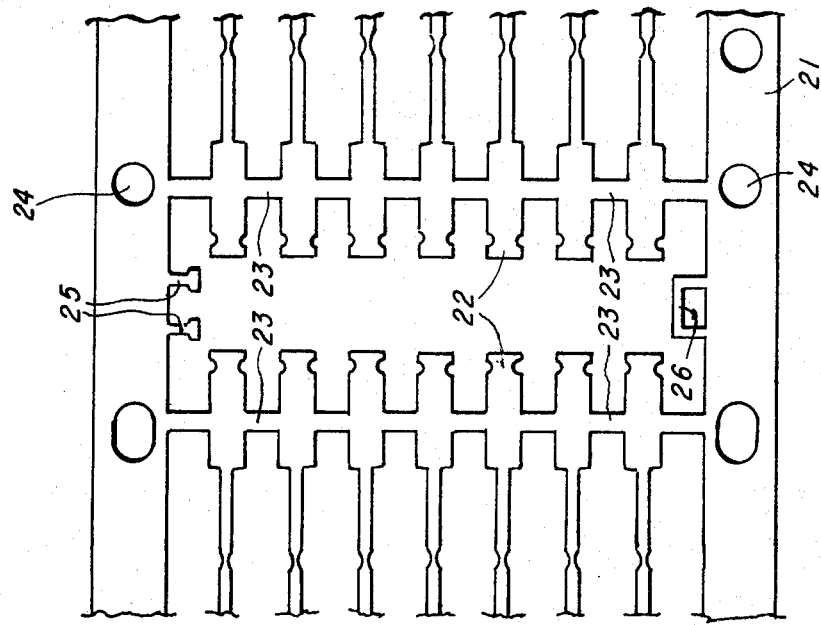
FIG. 2 is an enlarged plan view of the external lead frame, showing a single unit of the strip form.

As shown in FIG. 2, the preferred lead frame 21 consists of a copper alloy coated with a thin layer of tin for making the reflow joints between the interconnect patterns and lead ends 22. The simple rectangular geometry, and the convenience of lead ends having a width of 50 mils separated by a clearance of 50 mils between ends, are especially attractive. Tie bars 23 holding the leads in place are trimmed away after encapsulation. Sprocket holes 24 permit drive and indexing. Projections 25 and 26 are used to anchor the lead frame in the external plastic.

Figure 3:
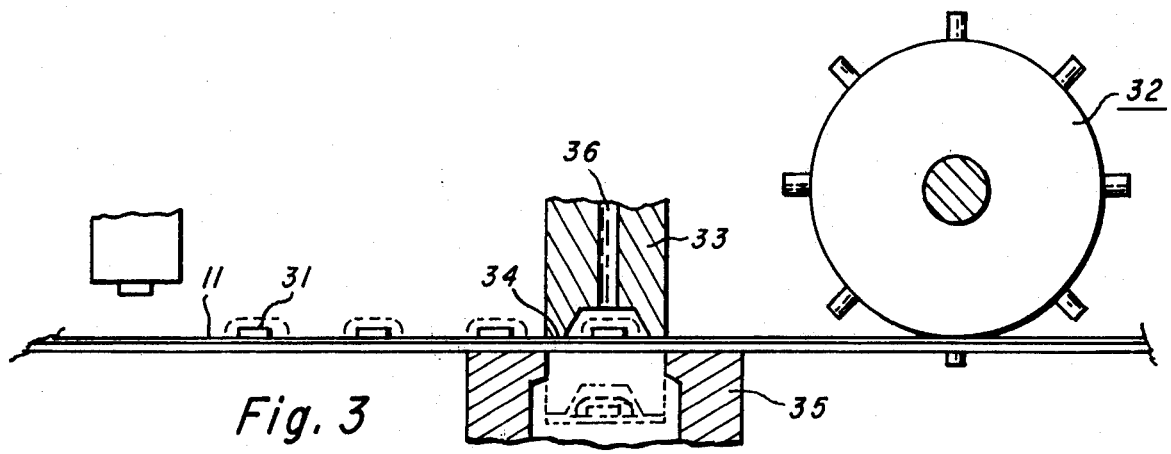
FIGS. 3, 4 and 5 are schematic elevational views, partly in section, showing the sequence of positions assumed by the punch, the lead frame and the interconnect pattern during the bonding of the external leads.

In FIG. 3, Kapton film 11 having interconnect patterns 16 thereon, with semiconductor chips 31 attached, is advanced by means of sprocket wheel 32 to a position in alignment with punching means 33 such that the parallel ridges 34 of punch 33 contact film 11 just opposite the parallel rows of bonding areas 17 (FIG. 1). As punch 33 is driven downward through shearing die 35, a portion of film 11 corresponding to one unit of the interconnect pattern, having a semiconductor chip therewith, is sheared from the continuous strip. The sheared portion is held on the tip of punch 33 by a vacuum applied through bore 36.

Figure 4:
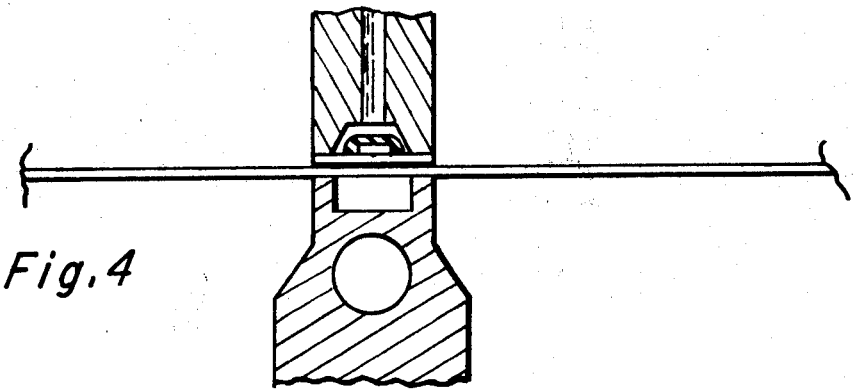

As shown in FIG. 4, the sheared unit is transferred by punch 33 to a position in mated contact with one unit of lead frame strip 21, whereby all fourteen bonding areas 17 are held in contact, respectively, with the fourteen lead ends 22 for bonding. As the film is transferred to the lead frame, heated bonding tool 41 is elevated to contact lead frame 21 for a time period sufficient to form the fourteen reflow joints. For example, the bonding tool is maintained at a constant temperature of about 500° C., and is held in contact with the lead frame for about 0.4 to 0.5 seconds, to form a reflow joint using a 232° C. fusion point solder.

Figure 5:
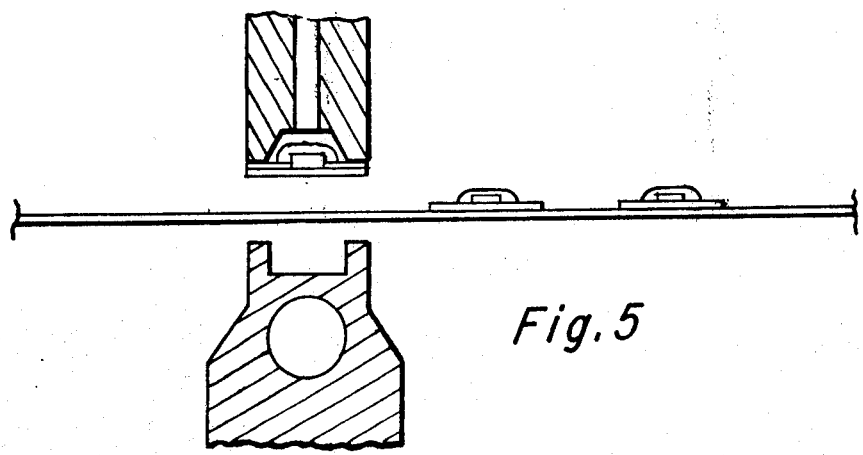

As shown in FIG. 5, the vacuum hold is released, the punch and bonding cool are withdrawn, the flexible insulator film is advanced to the next unit position, the lead frame strip is also advanced to the next unit position, the two are indexed in registration, and the bonding operation is repeated.

Figure 6:
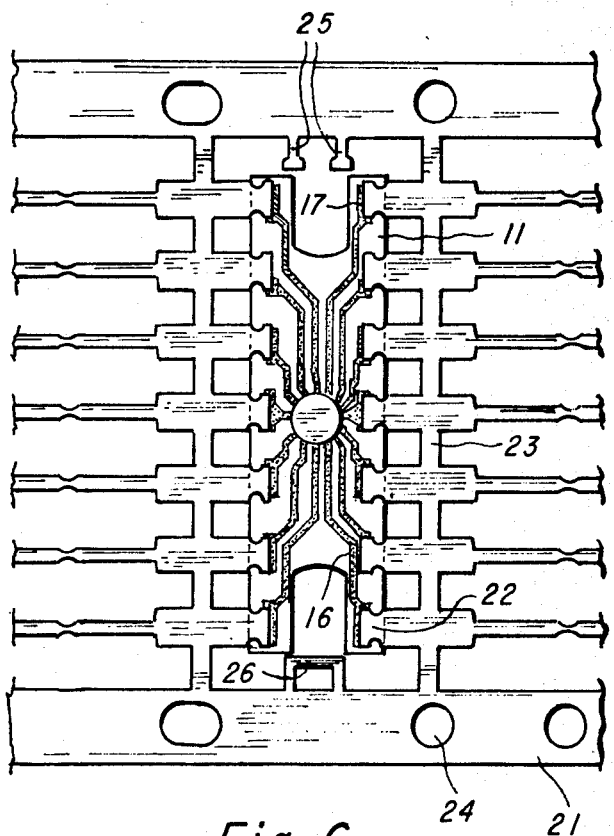
FIG. 6 is an enlarged plan view of a lead frame unit having a corresponding interconnect unit bonded thereto, with a semiconductor chip attached and protected by an epoxy "bubble".

In FIG. 6, a bonded unit is shown, in which the sheared portion of the film-supported interconnect pattern, carrying a semiconductor chip, has been solder-bonded to lead frame strip 21. The lead frame strip, having a chip and interconnect pattern bonded at each unit position as shown in FIG. 6, is then advanced to a plastic molding operation and encapsulated by known processes. Tie bars 23 are trimmed away, and the encapsulated units are separated from the waste portions of the lead frame strip. The completed unit is then ready for testing and shipment.

A further opportunity to improve stress relief lies in the selection of a suitable molding composition for encapsulation. In a preferred embodiment, the device of the invention is molded with the use of an epoxy Novolak composition having a glass transition temperature of about 150° C., and a small coefficient of thermal expansion at temperatures below the transition point.

Although a specific emmbodiment of the invention is disclosed above, it will be apparent that many variations are possible without departing from the proper scope of the invention. For example, while the preferred thin-film interconnects are patterned by etching the metal layer of a laminated Kapton composite, it will be apparent that other patterning techniques and other plastic films are available for substitution. Similarly, metals other than copper may be substituted for lead frame 21, and the number of leads is not limited to fourteen.

Also, it will be recognized by those skilled in the art that the bonding sequence illustrated by FIGS. 3, 4, and 5 is useful to attach circuit units to substrates other than the lead frame of FIG. 2, such as bonding to circuit boards, metallized ceramics, and flex circuits, for example.

What is claimed is:

1. A packaged semiconductor microcircuit comprising:
   a. two sets of parallel metallic leads, the geometry of each set being symmetrical with respect to the other set, each set consisting of leads terminating with a parallel row of tips spaced apart by a distance roughly equal to their width;
   b. a pattern of thin-film interconnects having first and second sets of terminals, said pattern being laminated with a flexible insulator support having an aperture therein, said first set of interconnect terminals being solder bonded to the tips of said metallic leads, said second set of interconnect terminals extending into said aperture;
   c. a semiconductor chip in said aperture bonded to said second set of terminals; and
   d. wherein said thin-film interconnect pattern consists essentially of a rolled copper film laminated to said support with a high-temperature polyamide resin adhesive.

2. A laminated, thin-film interconnect pattern composite for use in the assembly of integrated circuits comprising:
   a rolled copper alloy film patterned on a flexible strip of synthetic resin, and laminated thereto with a high temperature polyamide resin adhesive said alloy film comprising a plurality of symmetrical leads having terminals arranged in parallel rows along the edges of said resin strip.

* * * * *